United States Patent
So (10) Patent No.: US 10,700,141 B2
(45) Date of Patent: Jun. 30, 2020

(54) METHOD AND APPARATUS FOR INFRARED DETECTION AND DISPLAY

(75) Inventor: Franky So, Gainesville, FL (US)

(73) Assignee: University of Florida Research Foundation, Incorporated, Gainesville, FL (US)

(*) Notice: Subject to any disclaimer, the term of this patent is extended or adjusted under 35 U.S.C. 154(b) by 1448 days.

(21) Appl. No.: 11/865,505

(22) Filed: Oct. 1, 2007

(65) Prior Publication Data

US 2010/0181552 A1     Jul. 22, 2010

Related U.S. Application Data

(60) Provisional application No. 60/930,225, filed on May 14, 2007, provisional application No. 60/848,581, filed on Sep. 29, 2006.

(51) Int. Cl.
*H01L 31/00* (2006.01)
*H01L 27/32* (2006.01)
(Continued)

(52) U.S. Cl.
CPC ........ *H01L 27/3227* (2013.01); *H01L 27/288* (2013.01); *H01L 27/307* (2013.01);
(Continued)

(58) Field of Classification Search
CPC . H01L 27/288; H01L 27/307; H01L 27/3227; H01L 51/4213; H01L 51/428;
(Continued)

(56) References Cited

U.S. PATENT DOCUMENTS 4,614,958 A * 9/1986 Mikami ............... G02B 6/4246
                                              250/227.14
4,679,063 A * 7/1987 White .................. H01L 31/101
                                                250/338.4
(Continued)

FOREIGN PATENT DOCUMENTS

CN          1532959 A     9/2004
CN          1637628 A     7/2005
(Continued)

OTHER PUBLICATIONS

Chikamatsu, Masayuki, et al., "Light up-conversion from near-infrared to blue using a photoresponsive organic light-emitting device," *Applied Physics Letters*, Jul. 22, 2002, pp. 769-771. vol. 81, No. 4, American Institute of Physics, Melville, NY, US.
(Continued)

*Primary Examiner* — Vongsavanh Sengdara
(74) *Attorney, Agent, or Firm* — Wolf, Greenfield & Sacks, P.C.

(57) ABSTRACT

Embodiments of the subject invention relate to a method and apparatus for infrared (IR) detection. Organic layers can be utilized to produce a phototransistor for the detection of IR radiation. The wavelength range of the IR detector can be modified by incorporating materials sensitive to photons of different wavelengths. Quantum dots of materials sensitive to photons of different wavelengths than the host organic material of the absorbing layer of the phototransistor can be incorporated into the absorbing layer so as to enhance the absorption of photons having wavelengths associated with the material of the quantum dots. A photoconductor structure can be used instead of a phototransistor. The photoconductor can incorporate PbSe or PbS quantum dots. The photoconductor can incorporate organic materials and part of an OLED structure. A detected IR image can be displayed to a (Continued)

US 10,700,141 B2

Page 2 user. Organic materials can be used to create an organic light-emitting device.

35 Claims, 8 Drawing Sheets

(51) Int. Cl.
  *H01L 27/28* (2006.01)
  *H01L 27/30* (2006.01)
  *H01L 51/42* (2006.01)
  *H01L 51/00* (2006.01)
  *H01L 51/05* (2006.01)

(52) U.S. Cl.
  CPC ........ *H01L 51/428* (2013.01); *H01L 51/4213* (2013.01); *H01L 51/0053* (2013.01); *H01L 51/0081* (2013.01); *H01L 51/0504* (2013.01); *Y02E 10/52* (2013.01); *Y02E 10/549* (2013.01); *Y02P 70/521* (2015.11)

(58) Field of Classification Search
  CPC ............. H01L 51/0053; H01L 51/0081; H01L 51/0504; Y02E 10/549
  USPC ................. 257/270, 286, 365, 401, E29.023, 257/E29.027, E29.04, E29.117, E29.12, 257/E29.122, E29.134, E29.136, E29.264, 257/E29.275
  See application file for complete search history.

(56) References Cited

U.S. PATENT DOCUMENTS

| | | | |
|---|---|---|---|
| 4,755,674 A | 7/1988 | Schaaf | |
| 4,778,692 A * | 10/1988 | Ishihara | H01L 21/0237 136/258 |
| 4,885,211 A | 12/1989 | Tang et al. | |
| 5,121,398 A | 6/1992 | Rao | |
| 5,122,905 A | 6/1992 | Wheatley et al. | |
| 5,270,092 A | 12/1993 | Griffith et al. | |
| 5,315,129 A | 5/1994 | Forrest et al. | |
| 5,336,578 A | 8/1994 | Nukada et al. | |
| 5,389,788 A | 2/1995 | Grinberg et al. | |
| 5,438,198 A | 8/1995 | Ebitani et al. | |
| 5,619,039 A | 4/1997 | Montanari | |
| 5,710,428 A * | 1/1998 | Ko | G02B 23/12 250/332 |
| 5,811,834 A | 9/1998 | Tamano et al. | |
| 5,965,875 A | 10/1999 | Merrill | |
| 6,097,147 A | 8/2000 | Baldo et al. | |
| 6,140,646 A | 10/2000 | Busta et al. | |
| 6,337,492 B1 | 1/2002 | Jones et al. | |
| 6,509,574 B2 | 1/2003 | Yuan et al. | |
| 6,579,629 B1 | 6/2003 | Raychaudhuri et al. | |
| 6,734,452 B2 | 5/2004 | Gunapala et al. | |
| 6,777,961 B2 | 8/2004 | Hamamoto et al. | |
| 6,906,326 B2 | 6/2005 | Koch et al. | |
| 6,914,315 B2 | 7/2005 | Lai et al. | |
| 6,972,431 B2 | 12/2005 | Forrest et al. | |
| 7,247,850 B2 * | 7/2007 | Laou | H01L 27/14632 250/332 |
| 7,270,586 B2 | 9/2007 | Tokailin et al. | |
| 7,279,705 B2 | 10/2007 | Iou | |
| 7,300,731 B2 | 11/2007 | Wang | |
| 8,304,728 B2 | 11/2012 | So | |
| 8,405,028 B2 | 3/2013 | So | |
| 8,441,187 B2 | 5/2013 | Hunze et al. | |
| 8,507,865 B2 | 8/2013 | Boberl et al. | |
| 8,592,801 B2 | 11/2013 | So et al. | |
| 8,716,701 B2 | 5/2014 | So et al. | |
| 8,796,699 B2 | 8/2014 | So et al. | |
| 8,829,498 B2 | 9/2014 | So et al. | |
| 9,006,752 B2 | 4/2015 | So et al. | |
| 9,054,262 B2 | 6/2015 | Lewis et al. | |
| 9,196,661 B2 | 11/2015 | So et al. | |
| 9,214,502 B2 | 12/2015 | So et al. | |
| 9,276,048 B2 | 3/2016 | So | |
| 10,134,815 B2 | 11/2018 | So et al. | |
| 2002/0027206 A1 * | 3/2002 | Yuan et al. | 250/551 |
| 2002/0066904 A1 * | 6/2002 | Yuan | H01L 31/167 257/83 |
| 2002/0130248 A1 * | 9/2002 | Bretschneider et al. | 250/214 R |
| 2003/0122749 A1 | 7/2003 | Booth et al. | |
| 2003/0218166 A1 | 11/2003 | Tsutsui | |
| 2004/0016923 A1 | 1/2004 | Yu et al. | |
| 2004/0027059 A1 | 2/2004 | Tsutsui | |
| 2004/0031965 A1 * | 2/2004 | Forrest | H01L 27/288 257/79 |
| 2004/0121568 A1 * | 6/2004 | Kim | 438/584 |
| 2004/0135222 A1 | 7/2004 | Robert et al. | |
| 2004/0222306 A1 | 11/2004 | Fajarillo | |
| 2004/0253759 A1 | 12/2004 | Garber et al. | |
| 2004/0262614 A1 | 12/2004 | Hack et al. | |
| 2005/0077539 A1 | 4/2005 | Lipson | |
| 2005/0088079 A1 | 4/2005 | Daniels | |
| 2005/0088365 A1 | 4/2005 | Yamazaki et al. | |
| 2005/0104089 A1 | 5/2005 | Engelmann et al. | |
| 2005/0110007 A1 | 5/2005 | Forrest et al. | |
| 2005/0126628 A1 | 6/2005 | Scher et al. | |
| 2005/0137301 A1 | 6/2005 | Wu et al. | |
| 2005/0155641 A1 | 7/2005 | Fafard | |
| 2005/0156609 A1 | 7/2005 | Pfaff et al. | |
| 2005/0161703 A1 | 7/2005 | Costello | |
| 2005/0168137 A1 | 8/2005 | Adamovich et al. | |
| 2005/0236556 A1 * | 10/2005 | Sargent | B82Y 10/00 250/214.1 |
| 2006/0011927 A1 | 1/2006 | Ko | |
| 2006/0024526 A1 | 2/2006 | Thompson et al. | |
| 2006/0032528 A1 | 2/2006 | Wang | |
| 2006/0043361 A1 | 3/2006 | Lee et al. | |
| 2006/0081840 A1 | 4/2006 | Mori et al. | |
| 2006/0084347 A1 | 4/2006 | Tutt et al. | |
| 2006/0097247 A1 * | 5/2006 | Kim | B82Y 15/00 257/40 |
| 2006/0157806 A1 | 7/2006 | Rhodes | |
| 2006/0180197 A1 | 8/2006 | Gui et al. | |
| 2006/0186803 A1 | 8/2006 | Lim et al. | |
| 2006/0192125 A1 | 8/2006 | Yoganandan et al. | |
| 2006/0222979 A1 | 10/2006 | Ishida et al. | |
| 2006/0227531 A1 * | 10/2006 | Iou | H01L 27/288 362/84 |
| 2006/0266998 A1 * | 11/2006 | Vega | B82Y 10/00 257/21 |
| 2006/0290270 A1 | 12/2006 | Kim et al. | |
| 2007/0048548 A1 | 3/2007 | Kim et al. | |
| 2007/0051876 A1 | 3/2007 | Sumi et al. | |
| 2007/0062576 A1 | 3/2007 | Duerr et al. | |
| 2007/0096085 A1 | 5/2007 | Rand et al. | |
| 2007/0102694 A1 | 5/2007 | Drndic et al. | |
| 2007/0116983 A1 | 5/2007 | Kanno et al. | |
| 2007/0129545 A1 | 6/2007 | Inoue et al. | |
| 2007/0176541 A1 | 8/2007 | Son et al. | |
| 2007/0215868 A1 | 9/2007 | Forrest et al. | |
| 2007/0216985 A1 | 9/2007 | Woodall et al. | |
| 2007/0221888 A1 | 9/2007 | Sakata | |
| 2007/0235753 A1 * | 10/2007 | Debucquoy et al. | 257/113 |
| 2008/0041447 A1 | 2/2008 | Tseng et al. | |
| 2008/0066802 A1 | 3/2008 | Reddy | |
| 2008/0078444 A1 * | 4/2008 | Atanackovic | H01L 31/06 136/256 |
| 2008/0110499 A1 | 5/2008 | Chen et al. | |
| 2008/0138797 A1 | 6/2008 | Hunt et al. | |
| 2008/0142075 A1 | 6/2008 | Reddy et al. | |
| 2008/0223445 A1 | 9/2008 | Marks et al. | |
| 2008/0230120 A1 * | 9/2008 | Reddy | H01L 27/302 136/260 |
| 2008/0272713 A1 | 11/2008 | Kang et al. | |
| 2009/0045728 A1 | 2/2009 | Murano et al. | |
| 2009/0115310 A1 | 5/2009 | Yamamoto | |
| 2009/0140238 A1 | 6/2009 | Brabec et al. | |
| 2009/0152664 A1 | 6/2009 | Klem et al. | |

(56) References Cited

U.S. PATENT DOCUMENTS

| | | |
|---|---|---|
| 2009/0206745 A1 | 8/2009 | Hwang et al. |
| 2009/0208776 A1 | 8/2009 | Liu et al. |
| 2009/0214967 A1 | 8/2009 | Iwanaga et al. |
| 2009/0217967 A1 | 9/2009 | Hovel et al. |
| 2009/0223566 A1 | 9/2009 | Mitsui et al. |
| 2009/0286338 A1 | 11/2009 | Coe-Sullivan et al. |
| 2009/0301556 A1 | 12/2009 | Kawano et al. |
| 2009/0321726 A1 | 12/2009 | Thompson |
| 2010/0025662 A1 | 2/2010 | Cho et al. |
| 2010/0044676 A1 | 2/2010 | Sargent et al. |
| 2010/0044767 A1 | 2/2010 | Chaudhry et al. |
| 2010/0059097 A1 | 3/2010 | McDonald et al. |
| 2010/0116995 A1 | 5/2010 | Levene et al. |
| 2010/0133418 A1 | 6/2010 | Sargent et al. |
| 2010/0133434 A1 | 6/2010 | Meng et al. |
| 2010/0133522 A1 | 6/2010 | Pieh et al. |
| 2010/0141122 A1 | 6/2010 | Begley et al. |
| 2010/0229921 A1 | 9/2010 | Farris et al. |
| 2010/0233842 A1 | 9/2010 | Grein et al. |
| 2010/0243053 A1 | 9/2010 | Coe-Sullivan et al. |
| 2010/0255601 A1* | 10/2010 | Beaudet ............ G01N 21/6428 436/172 |
| 2010/0282309 A1 | 11/2010 | Pschirer et al. |
| 2010/0294936 A1 | 11/2010 | Boeberl et al. |
| 2010/0302419 A1 | 12/2010 | Den Boer et al. |
| 2010/0326506 A1 | 12/2010 | Lifshitz et al. |
| 2011/0012091 A1 | 1/2011 | Forrest et al. |
| 2011/0031399 A1 | 2/2011 | So |
| 2011/0031403 A1 | 2/2011 | So |
| 2011/0049489 A1 | 3/2011 | Forrest et al. |
| 2011/0068330 A1 | 3/2011 | Akimoto et al. |
| 2011/0073835 A1 | 3/2011 | Ren et al. |
| 2011/0079706 A1 | 4/2011 | Michalewicz |
| 2011/0114921 A1 | 5/2011 | Yang et al. |
| 2011/0116078 A1 | 5/2011 | Cho et al. |
| 2011/0140075 A1 | 6/2011 | Zhou et al. |
| 2011/0248249 A1 | 10/2011 | Forrest et al. |
| 2011/0303906 A1 | 12/2011 | Goldman |
| 2012/0068140 A1 | 3/2012 | Greenham et al. |
| 2012/0126204 A1 | 5/2012 | So et al. |
| 2012/0187295 A1 | 7/2012 | So et al. |
| 2012/0193689 A1 | 8/2012 | Park et al. |
| 2012/0241723 A1 | 9/2012 | Klem et al. |
| 2012/0286296 A1 | 11/2012 | So et al. |
| 2013/0044250 A1 | 2/2013 | Senda et al. |
| 2013/0206988 A1 | 8/2013 | So |
| 2013/0215496 A1 | 8/2013 | Ban et al. |
| 2014/0054540 A1 | 2/2014 | Thou et al. |
| 2014/0060613 A1 | 3/2014 | So et al. |
| 2014/0111652 A1 | 4/2014 | So et al. |
| 2014/0217284 A1 | 8/2014 | So et al. |
| 2014/0326921 A1 | 11/2014 | Lu et al. |
| 2014/0353502 A1 | 12/2014 | So et al. |
| 2014/0367572 A1 | 12/2014 | So et al. |
| 2015/0001395 A1 | 1/2015 | So et al. |
| 2015/0151980 A1 | 6/2015 | Tisdale et al. |
| 2015/0372046 A1 | 12/2015 | Kim et al. |
| 2017/0117335 A1 | 4/2017 | So et al. |
| 2019/0006541 A1 | 1/2019 | So et al. |

FOREIGN PATENT DOCUMENTS

| | | |
|---|---|---|
| CN | 1773732 A | 5/2006 |
| CN | 1806343 A | 7/2006 |
| CN | 1856888 A | 11/2006 |
| CN | 101340749 A | 1/2009 |
| CN | 101405888 A | 4/2009 |
| CN | 101421664 A | 4/2009 |
| CN | 101558348 A | 10/2009 |
| CN | 101794834 A | 8/2010 |
| CN | 101872793 A | 10/2010 |
| CN | 102725616 A | 10/2012 |
| EP | 0 508 970 A1 | 10/1992 |
| EP | 0 848 433 A2 | 6/1998 |
| EP | 0 569 257 B1 | 6/2002 |
| EP | 1 351 558 A1 | 10/2003 |
| EP | 1 498 960 A2 | 1/2005 |
| JP | S58-215081 A | 12/1983 |
| JP | S60-030163 A | 2/1985 |
| JP | S61-149831 A | 7/1986 |
| JP | S63-088872 | 4/1988 |
| JP | S64-012583 A | 1/1989 |
| JP | H02-016421 A | 1/1990 |
| JP | H02-224279 A | 9/1990 |
| JP | H03-079693 A | 4/1991 |
| JP | H04-204333 A | 7/1992 |
| JP | H07-122762 A | 5/1995 |
| JP | 7175420 | 7/1995 |
| JP | H08-007096 A | 1/1996 |
| JP | H10-065200 A | 3/1998 |
| JP | H10-242493 A | 9/1998 |
| JP | H11-329736 A | 11/1999 |
| JP | 2000-277265 A | 10/2000 |
| JP | 2000-349365 A | 12/2000 |
| JP | 2001-006876 A | 1/2001 |
| JP | 2001-076882 | 3/2001 |
| JP | 2002-523904 A | 7/2002 |
| JP | 2002-340668 A | 11/2002 |
| JP | 2003-083809 A | 3/2003 |
| JP | 2003-178887 A | 6/2003 |
| JP | 2004-511911 | 4/2004 |
| JP | 2005-522005 | 7/2005 |
| JP | 2005-266537 A | 9/2005 |
| JP | 2005-277113 A | 10/2005 |
| JP | 2006-013103 A | 1/2006 |
| JP | 2006-066395 | 3/2006 |
| JP | 2006-128437 | 5/2006 |
| JP | 2006-518110 | 8/2006 |
| JP | 2006-251555 A | 9/2006 |
| JP | 2007-519237 A | 7/2007 |
| JP | 2008-016831 | 1/2008 |
| JP | 2008-053736 A | 3/2008 |
| JP | 2008-523615 A | 7/2008 |
| JP | 2009-509129 A | 3/2009 |
| JP | 2009-520358 A | 5/2009 |
| JP | 2009-527108 A | 7/2009 |
| JP | 2009-192919 A | 8/2009 |
| JP | 2009-531837 A | 9/2009 |
| JP | 2009-253173 A | 10/2009 |
| JP | 2009-272528 A | 11/2009 |
| JP | 2010-506386 A | 2/2010 |
| JP | 2010-067642 A | 3/2010 |
| JP | 2010-067802 A | 3/2010 |
| JP | 2010-087205 A | 4/2010 |
| JP | 2010-192931 A | 9/2010 |
| JP | 2010-263030 A | 11/2010 |
| JP | 2010-534409 A | 11/2010 |
| JP | 2011-098948 A | 5/2011 |
| JP | 2012-524991 A | 10/2012 |
| JP | 2013-512439 A | 4/2013 |
| JP | 2014-511041 A | 5/2014 |
| KR | 1020090080056 A | 7/2009 |
| TW | 200637425 A | 10/2006 |
| TW | 200847449 A | 12/2008 |
| TW | 201041203 A | 11/2010 |
| WO | WO 02/099896 A1 | 12/2002 |
| WO | WO-2003/084292 | 10/2003 |
| WO | WO-2004/073082 | 8/2004 |
| WO | WO 2005/069387 A1 | 7/2005 |
| WO | WO-2005-101530 | 10/2005 |
| WO | WO 2006/130717 A2 | 12/2006 |
| WO | WO 2007/017475 A1 | 2/2007 |
| WO | WO 2007/095386 A1 | 8/2007 |
| WO | WO 2007/102051 A2 | 9/2007 |
| WO | WO 2007/131126 A2 | 11/2007 |
| WO | WO 2008/042859 A2 | 4/2008 |
| WO | WO 2008/054845 A2 | 5/2008 |
| WO | WO 2008/140601 A1 | 11/2008 |
| WO | WO 2009/074993 A2 | 6/2009 |
| WO | WO 2009/116511 A1 | 9/2009 |
| WO | WO 2010/070563 A2 | 6/2010 |
| WO | WO 2010/120393 A2 | 10/2010 |
| WO | WO 2010/142575 A2 | 12/2010 |

(56) References Cited

FOREIGN PATENT DOCUMENTS

| WO | WO 2010/142947 A1 | 12/2010 |
| --- | --- | --- |
| WO | WO 2011/033974 A1 | 3/2011 |
| WO | WO 2011/066396 A2 | 6/2011 |
| WO | WO 2012/138651 A2 | 10/2012 |
| WO | WO 2012/168192 A2 | 12/2012 |
| WO | WO 2012/170457 A2 | 12/2012 |
| WO | WO 2012/178071 A2 | 12/2012 |
| WO | WO 2013/003850 A2 | 1/2013 |
| WO | WO 2015/081005 A1 | 6/2015 |

OTHER PUBLICATIONS

Luo, H., et al., "Optical upconverter with integrated heterojunction phototransistor and light-emitting diode." *Applied Physics Letters*, Feb. 13, 2006, pp. 73501, vol. 88, No. 7, Melville, NY, US.
Emagin Corporation, "OLED-display-for-thermal-imaging-head," *Military and Aerospace Electronics Magazine*, Oct. 7, 2003, US.
Ban, D., et al., "Near-infrared to visible light optical upconversion by direct tandem integration of organic light-emitting diode and inorganic photodetector," *Applied Physics Letters*, Feb. 27, 2007, pp. 93108, vol. 90, No. 9, American Institute of Physics, Melville, NY, US.
Office Action dated Feb. 17, 2012 in U.S. Appl. No. 12/910,453.
Office Action dated Feb. 3, 2012 in U.S. Appl. No. 12/910,473.
Office Action dated Aug. 8, 2012 in U.S. Appl. No. 12/910,473.
Yase, K., et al., "Organic Light-emitting Devices with Photoresponsive Layer," Pacific Rim Conference on Lasers and Electro-Optics, Tokyo, Jul. 11-15, 2005, pp. 569-570.
Canadian Office Action dated Feb. 24, 2014 in connection with Application No. 2,665,047.
Translation of Korean Office Action dated Jul. 23, 2014 in connection with Application No. 10-2009-7008875.
Translation of Korean Office Action dated Aug. 31, 2013 in connection with Application No. 10-2009-7008875.
Translation of Japanese Office Action dated Sep. 12, 2013 in connection with Application No. 2009-530671.
Translation of Korean Office Action dated Jun. 2, 2014 in connection with Application No. 10-2014-7005504.
International Search Report dated Jun. 25, 2008 in connection with Application No. PCT/US2007/080104.
International Preliminary Report on Patentability and Written Opinion dated Mar. 31, 2009 in connection with Application No. PCT/US2007/080104.
Lee et al., Unraveling the Gain Mechanism in High Performance Solution-Processed PbS Infrared Pin Photodiodes. Advanced Functional Materials. 2015;25:1233-1238.
Extended European Search Report for European Application No. 16842459.6 dated Feb. 18, 2019.
Shen et al., Role of Electrode Contamination in Electron Injection at Mg:Ag/Alq3 Interfaces. Adv. Matter. 1999;11(8):1523-7.
Weidman et al., Monodisperse, Air-Stable PbS Nanocrystals via Precursor Stoichiometry Control. ACS Nano. 2014;8(6):6363-71. DOI: 10.1021/nn5018654.
Chinese First Office Action dated Mar. 25, 2019 for Chinese Application No. 201680033386.3.
Kim et al., Electrical and Optical Properties of Phosphorescent Organic Light-Emitting Devices with a TAPC Host. Transactions on Electrical and Electronic Materials. 2011;12(2):84-87. DOI: 10.4313/TEEM.2011.12.2.84.
Extended European Search Report dated Jul. 19, 2016 in connection with Application No. EP 10833930.0.
Extended European Search Report dated May 27, 2016 for Application No. EP 11787262.2.
Extended European Search Report dated Jul. 25, 2016 in connection with Application No. EP 14791448.5.
Extended European Search Report dated Nov. 3, 2014 in connection with Application No. EP 11843638.5.
Extended European Search Report dated Apr. 20, 2015 in connection with Application No. EP 12797523.3.
Extended European Search Report dated Feb. 4, 2015 in connection with Application No. EP 12804913.7.
Summons to Attend Oral Proceedings for European Application No. 12804913.7 dated Aug. 14, 2018.
Extended European Search Report for European Application No. 11859661.8 dated Jun. 26, 2017.
Extended European Search Report for European Application No. 12825553.6 dated Dec. 1, 2017.
Extended European Search Report dated Sep. 8, 2014 in connection with Application No. 1276466.1.
International Search Report and Written Opinion dated Jul. 29, 2011 in connection with Application No. PCT/US2010/058015.
International Search Report and Written Opinion dated Jan. 4, 2012, in connection with Application No. PCT/US2011/037772.
International Search Report and Written Opinion dated Nov. 24, 2014 in connection with Application No. PCT/US2014/012722.
Third Party Observation dated Feb. 12, 2015 in connection with Application No. PCT/US2014/012722.
International Search Report and Written Opinion dated Mar. 6, 2012 in connection with Application No. PCT/US2011/056180.
International Search Report and Written Opinion dated Jan. 29, 2013 in connection with Application No. PCT/US2012/040980.
International Search Report and Written Opinion dated Jan. 7, 2013 in connection with Application No. PCT/US2012/045272.
International Search Report and Written Opinion dated Mar. 19, 2012 in connection with Application No. PCT/US2011/056178.
International Search Report and Written Opinion dated Nov. 23, 2012 in connection with Application No. PCT/US2012/026920.
International Search Report and Written Opinion dated Oct. 31, 2012 in connection with Application No. PCT/US2012/031988.
International Search Report and Written Opinion dated Mar. 3, 2017 for Application No. PCT/US2016/037056.
[No Author Listed], Background Information on CCD and CMOS Technology. Ted Pella, Inc. https://www.tedpella.com/cameras_htmlccd_cmos.htm 2009. p. 1-3.
Ban et al., 1.5 µm Optical Up-Conversion: Wafter Fusion and Related Issues. Proc SPIE. 2004;5543:47-55.
Borsenberger et al., Hole transport in 1, 1-bis(di-4-tolylaminophenyl)cyclohexane. Journal of Chemical Physics. 1991;94(12):8276-81.
Burgi et al., A microscopic view of charge transport in polymer transistors. Synthetic Me. 2004;146(3):297-309.
Carlson et al., Amorphous silicon solar cell. Appl Phys Lett. 1976;28:671-3.
Chen et al., Near-infrared inorganic/organic optical upconverter with an external power efficiency of >100%. Adv Mater. Nov. 16, 2010;22(43):4900-4. doi: 10.1002/adma.201001946.
Chen et al., Near-infrared optical upconverter based on i-In0.53Ga0.47As/C60 photovoltaic heterojunction. Electron Lett. Jul. 2009;45(14):753-5.
Chikamatsu et al., Photoresponsive organic electroluminescent devices. J Photochem Photobiol A: Chem. Jun. 1, 2003;158(2-3):215-8.
Gong et al., High-Detectivity Polymer Photodetectors with Special Response from 300 nm to 1450 nm. Sci. Sep. 25, 2009;325:1665-7.
Gong et al., Semiconducting Polymer Photodetectors with Electron and Hole Blocking Layers: High Detectivity in the Near-Infrared. Sensors. Jul. 1, 2010;10:6488-96.
Im et al., Near-infrared photodetection based on PbS colloidal quantum dots/organic hole conductor. Org Electron. Jan. 4, 2010;11(4):696-9.
Kim et al., Organic infrared upconversion device. Adv Mater. May 25, 2010;22(20):2260-3. doi: 10.1002/adma. 200903312.
Kim et al., PbSe nanocrystal-based infrared-to-visible upconversion device. Nano Lett. May 11, 2011;11(5):2109-13. doi: 10.1021/nl200704h. Epub Apr. 19, 2011. 5 pages.
Kim, Organic Photovoltaic Cells and Organic Up-Convertion Devices. University of Florida. Thesis. May 31, 2009. 173 pages.
Kim, Organic Photovoltaic Cells and Organic Up-Convertion Devices. University of Florida. Thesis. May 31, 2009. 84 pages.
Konstantatos et al., Solution-Processed Quantum Dot Photodetectors. Proc IEEE. Oct. 2009;97(10):1666-83.

(56) References Cited

OTHER PUBLICATIONS

Konstantatos, Sensitive solution-processed quantum dot photodetectors. PhD Thesis Graduate Dept of Electrical and Computer Engineering. University of Toronto. 2008:133 pages.

Kulkarni et al., High-Performance Organic Light-Emitting Diodes Based on Intramolecular Charge-Transfer Emission from Donor-Acceptor Molecules: Significance of Electron-Donor Strength and Molecular Geometry. Advanced Functional Materials. 2006;16(8):1057-66.

Lepnev et al., Two-diode organic light amplifiers/converters and peculiarities of photocurrent multiplaction. Synth Met. Apr. 5, 2006;156(7-8):624-32.

McDonald et al., Solution-processed PbS quantum dot infrared photodetectors and photovoltaics. Nat Mater. Feb. 2005;4:138-43. Supplementary Figure. 1 page.

Mustafa et al., Solution processed nickel oxide anodes for organic photovoltaic devices. Appl Phys Lett. 2014;104(6):e063302.1-5.

Ni et al., Organic light-emitting diode with TiOPc layer—A new multifunctional optoelectronic device. Jpn J Appl Phys. 2001;40:L948-51. doi:10.1143/JJAP.40.L948.

Overton, Detectors: Near-IR image uses quantum-dot-sensitized photodiodes. Laser Focus World. Sep. 2009:25-8.

Sarasqueta et al., Organic and inorganic blocking layers for solution-processed colloidal PbSe nanocrystal infrared photodetectors. Adv Funct Mater. 2011;21(1):167-71.

Sargent, Infrared Quantum Dots. Adv Mater. Mar. 8, 2005;17(5):515-22.

Sun et al., White light from polymer light-emitting diodes: Utilization of fluorenone defects and exciplex. Applied Physics Letters. 2006;88(16):163510.

Wagner et al., Change of electrochemical impedance spectra (EIS) with time during CO-poisoning of the Pt-anode in a membrane fuel cell. J Power Science. Mar. 10, 2004;127(1-2):3417.

Wang et al., Correlation between mechanical stress and optical properties of $SiO_2/Ta_2O_5$ multilayer UV narrow-bandpass filters deposited by plasma ion-assisted deposition. Proc of SPIE. Aug. 2005;5870:58700e.1-9.

Xie et al., InAs/InP/ZnSe Core/Shell/Shell Quantum Dots as Near-Infrared Emitters: Bright, Narrow-Band, Non-Cadmium Containing, and Biocompatible. Nano Res. 2008;1:457-64.

Yang et al., Semiconductor infrared up-conversion devices. Prog Quant Electr. 2011;35:77108.

Yin et al., Colloidal nanocrystal synthesis and the organic-inorganic interface. Nature. Sep. 29, 2005;437:664-70.

\* cited by examiner

FIG. 4 tris-(8-hydroxyquinoline)
aluminum (Alq3)

4-4'-bis[N-(1-naphthyl)-N-
phenyl-amino]biphenyl (NPD)

copper phthalocyanine (CuPc)

perylene-3,4!8,10-tetra-carboxylic-
diimide-di~2,6-isopropy~phenyl
(PTCDI)

METHOD AND APPARATUS FOR INFRARED DETECTION AND DISPLAY

CROSS-REFERENCE TO RELATED APPLICATIONS

The present application claims the benefit of U.S. Application Ser. No. 60/930,225, filed May 14, 2007, and claims the benefit of U.S. Application Ser. No. 60/848,581, filed Sep. 29, 2006, both of which are hereby incorporated by reference herein in their entirety, including any figures, tables, or drawings.

BACKGROUND OF INVENTION

There are many applications for detecting infrared (IR) radiation. IR can refer to radiation having wavelengths longer than visible light (>0.7 μm) up to about 14 μm, with near-IR being a subset referring to wavelengths from about 0.7 μm to about 1.0 μm. One application is the detection of IR in environments with low ambient light, which can occur, for example, at night. It can also be useful to display to a user the image of the detected IR at a wavelength visible to the user. One common device for detecting IR images and displaying the detected images to a user is night-vision goggles.

Conventional night vision goggles are complex electro-optical devices that can require very high operating voltages and cost thousands of dollars. Typical night vision goggles intensify existing light instead of relying on their own light source and are sensitive to a broad spectrum of light, from visible through infrared. A conventional lens, called the objective lens, captures ambient light, including some near-infrared light. The gathered light is then sent to an image-intensifier tube. The tube outputs a high voltage, e.g., about 5,000 volts, to the image-tube components. The image-intensifier tube has a photo cathode, which is used to convert the photons of light energy into electrons. As the electrons pass through the tube, similar electrons are released from atoms in the tube, multiplying the original number of electrons by a factor of thousands through the use of a micro channel plate (MCP) in the tube. When the electrons from the photo cathode hit the first electrode of the MCP, they are accelerated into the glass micro channels by the 5,000-V bursts being sent between the electrode pair. As electrons pass through the micro channels, they cause thousands of other electrons to be released in each channel using a process called cascaded secondary emission. These new electrons also collide with other atoms, creating a chain reaction that results in thousands of electrons leaving the channel where only a few entered. At the end of the image-intensifier tube, the electrons hit a screen coated with phosphors. These electrons maintain their position in relation to the channel they passed through, which provides a perfect image since the electrons stay in the same alignment as the original photons. The energy of the electrons causes the phosphors to reach an excited state and release photons. These phosphors create the green image on the screen that has come to characterize night vision. The green phosphor image is viewed through another lens called the ocular lens, which allows you to magnify and focus the image. The night vision device may be connected to an electronic display, such as a monitor, or the image may be viewed directly through the ocular lens.

Accordingly, there is a need for IR sensors/detectors, and IR sensor/detector-display combinations, that operate at low operating voltages and are lightweight and cost-effective to produce.

BRIEF SUMMARY

Embodiments of the subject invention relate to a method and apparatus for infrared (IR) detection. A specific embodiment utilizes organic layers to produce a phototransistor for the detection of IR radiation. The wavelength range of the IR detector can be modified by incorporating materials sensitive to photons of different wavelengths. In a specific embodiment, quantum dots of materials sensitive to photons of different wavelengths than the host organic material of the absorbing layer of the phototransistor can be incorporated into the absorbing layer so as to enhance the absorption of photons having wavelengths associated with the material of the quantum dots.

In another embodiment, a photoconductor structure can be used instead of a phototransistor. In one embodiment, the photoconductor can incorporate PbSe or PbS quantum dots. In another embodiment, the photoconductor can incorporate organic materials.

Specific embodiments also involve displaying a detected IR image to a user. In a specific embodiment, organic materials can be used to create an organic light-emitting device. Additional material that emits at different wavelengths can be added to the light-emitting layer. In a specific embodiment, quantum dots of materials associated with emission of photons of different wavelengths than the host organic material of the emission layer can be incorporated into the emission layer to enhance the output display of the organic light-emitting device to the user. In a preferred embodiment, the IR detection is accomplished with a phototransistor and the displaying of the detected IR image is accomplished with an organic light-emitting device such as an organic light-emitting diode (OLED). In a more preferred embodiment, the phototransistor and OLED are in series.

Embodiments of the subject invention pertain to a method and apparatus for night vision. In an embodiment, a night vision device can be accomplished by the deposition of layers of organic thin films. Embodiments of the subject device can operate at low operating voltages, such as 10-15 V. In addition, the cost of manufacturing specific embodiments of the subject device can be lower than the cost of manufacturing conventional night vision systems. In an embodiment of the subject night vision device an organic phototransistor can be in series with an organic light-emitting device, such as an organic light-emitting diode (OLED).

DETAILED DESCRIPTION

Embodiments of the subject invention relate to a method and apparatus for infrared (IR) detection. A specific embodiment utilizes organic layers to produce a phototransistor for the detection of IR radiation. The wavelength range of the IR detector can be modified by incorporating materials sensitive to photons of different wavelengths. In a specific embodiment, quantum dots of materials sensitive to photons of different wavelengths than the host organic material of the absorbing layer of the phototransistor can be incorporated into the absorbing layer so as to enhance the absorption of photons having wavelengths associated with the material of the quantum dots.

In another embodiment, a photoconductor structure can be used instead of a phototransistor. In one embodiment, the photoconductor can incorporate PbSe or PbS quantum dots. In another embodiment, the photoconductor can incorporate organic materials.

Specific embodiments also involve displaying a detected IR image to a user. In a specific embodiment, organic materials can be used to create an organic light-emitting device. Additional material that emits at different wavelengths can be added to the light-emitting layer. In a specific embodiment, quantum dots of materials associated with emission of photons of different wavelengths than the host organic material of the emission layer can be incorporated into the emission layer to enhance the output display of the organic light-emitting device to the user. In a preferred embodiment, the IR detection is accomplished with a phototransistor and the displaying of the detected IR image is accomplished with an organic light-emitting device such as an organic light-emitting diode (OLED). In a more preferred embodiment, the phototransistor and OLED are in series.

Embodiments of the subject invention pertain to a method and apparatus for night vision. In an embodiment, a night vision device can be accomplished by the deposition of layers of organic thin films. Embodiments of the subject device can operate at low operating voltages, such as 10-15 V. In addition, the cost of manufacturing specific embodiments of the subject device can be lower than the cost of manufacturing conventional night vision systems. In an embodiment of the subject night vision device an organic phototransistor can be in series with an organic light-emitting device, such as an organic light-emitting diode (OLED).

Figure 1:
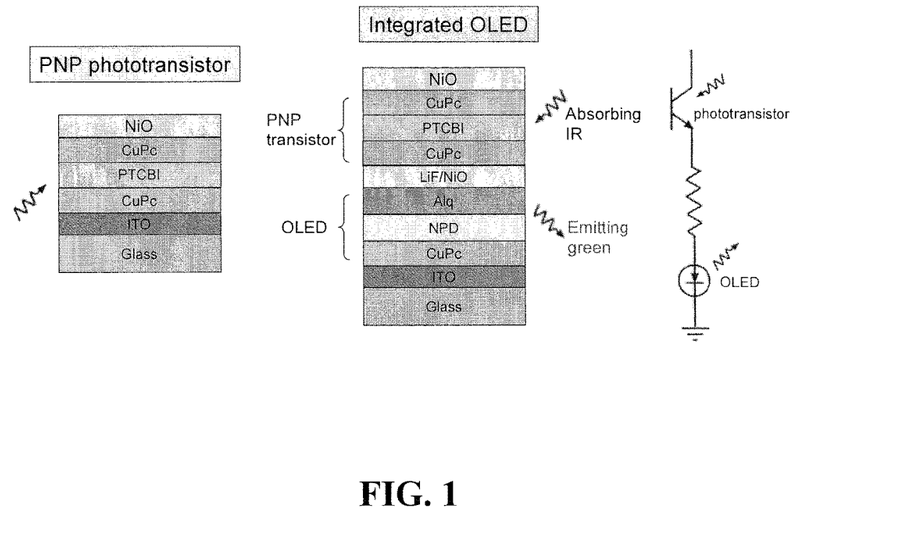
FIG. 1 shows an embodiment of a two-dimensional infrared image sensor/detector, a two-dimensional infrared image sensor/display array without pixelation, and a circuit model of the sensor/display array.

Preferably, electrodes that are transparent to infrared light are used to allow IR radiation to enter the phototransistor. A schematic diagram of an embodiment of an IR sensor/detector, an embodiment of an IR sensor-display combination, and a circuit model for the IR sensor-display combination are shown in FIG. 1. A PNP bipolar phototransistor created using layers of organic material is shown on the left of FIG. 1. Here, CuPc is the n-layer and PTCBI is the p-layer. Although the curved arrow symbolizing light (absorbing IR and emitting green) are shown pointing to the absorption layer and emission layer, respectively, the IR light enters from the top and the visible light is emitted from the bottom of the device shown in FIG. 1. In the middle of FIG. 1, the integration of the phototransistor shown on the left with an OLED is shown. IR images can be incident on the top of the electrode layer (NiO) of the phototransistor and pass through the CuPc layer and into the absorption layer (PTCBI).

Upon photoexcitation with infrared light, charge carriers are generated in the phototransistor and injected into the OLED, which then generates photons in the visible range. Because of the low conductivity of organic thin films, the electric field will be confined within the photoexcited area and visible photons will be generated within the excited area. As a result, if a broad area device is exposed to an infrared image, a visible image will be generated. Preferably, an electrode transparent to visible light is used at the bottom, where the output image is emitted. In the embodiment shown, ITO is used as an electrode, which is transparent to visible light. Other materials can also be used. A circuit diagram of the integrated device shown in the middle is shown on the right side of FIG. 1. In a specific embodiment, no electronics are required to operate the device. In an embodiment, the operating voltages of the phototransistor and the light-emitting device are less than 10 V, such that the total operating voltages can be less than 20 V. This device can be made very light weight.

In an embodiment, glass can be used as a substrate for fabrication. The entire phototransistor and OLED combination can be very thin, for example, less than 1 μm. The glass substrate with the thin layer can then be made part of night vision goggles where the thin layer is positioned to receive an IR image and a user is positioned to see the visible image emitted from the glass, or plastic, substrate.

Figure 2:
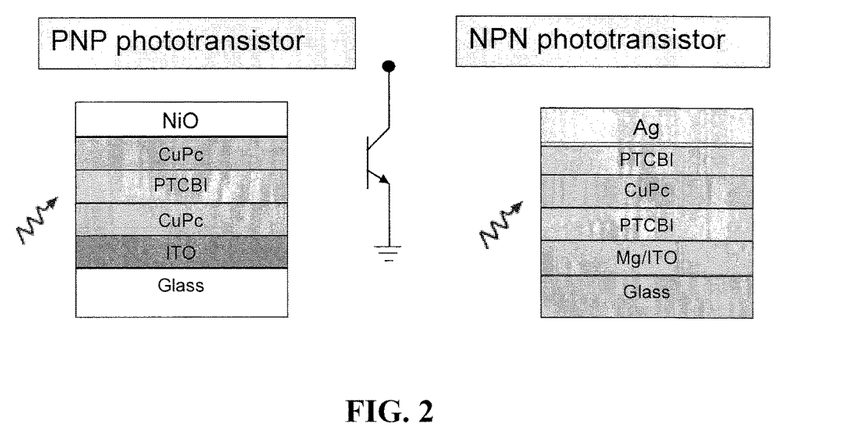
FIG. 2 shows a PNP bipolar phototransistor and an NPN bipolar phototransistor in accordance with embodiments of the subject invention.

FIG. 2 shows the PNP bipolar transistor of FIG. 1 and an NPN phototransistor, which can also be utilized in accordance with the subject invention.

The fabrication procedure for a specific embodiment of the subject IR detector-display combination will now be described. This fabrication procedure does not require any patterning. Other fabrication techniques, as well as other materials, as would be apparent to one skilled in the art having the benefit of the subject disclosure, can also be utilized in accordance with the subject invention. Devices are grown on a glass substrate or plastic substrate precoated with a 100 nm thick layer of indium-tin-oxide having a sheet resistance of 20 ohms/square. Substrates are degreased with solvents and then cleaned by exposure to oxygen plasma and UV-ozone ambient. All layers are vacuum deposited grown in succession without breaking the vacuum. In the first deposition step on top of the indium-tin-oxide (ITO) layer, to fabricate the integrated PNP phototransistor and OLED shown in the middle of FIG. 1, a 10-nm-thick CuPc is deposited as a hole injection layer. A 50 nm-thick NPD layer is then grown and acts as a hole transport layer. Next, a 60 nm-thick Alq3 emissive layer is deposited. A LiF(2 nm)/NiO (10 nm) charge generation layer is then deposited. This results in an OLED. To fabricate the phototransistor on the top of the light emitting device, a 40 nm thick CuPc layer, a 50 nm thick PTCBI layer, a 40 nm thick CuPc layer, and a 1000 nm NiO layer are then deposited.

Figure 3:
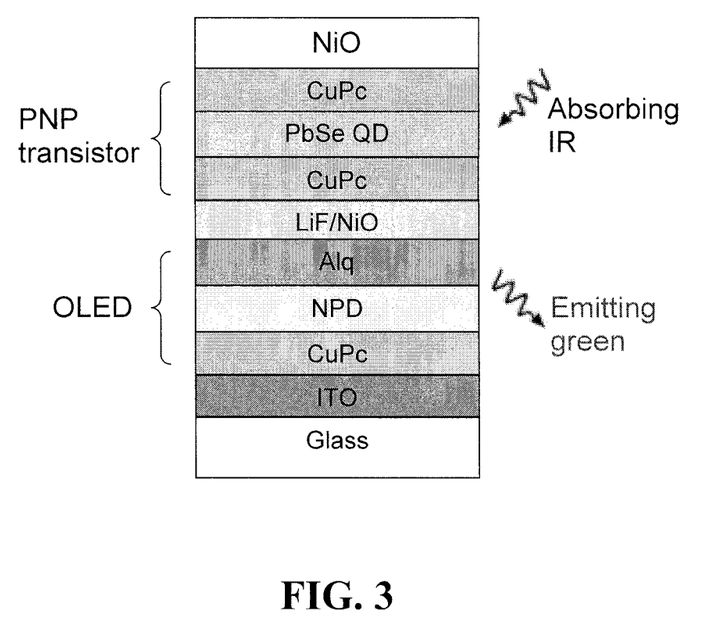
FIG. 3 shows an embodiment of an infrared image/sensor display array using PbSe quantum dots in the absorption layer.

In another specific embodiment, referring to FIG. 3, the PTCBI layer of the phototransistor is replaced with a PbS or PbSe quantum dot layer. The PbS or PbSe absorbs photons of different wavelengths than the PTCBI layer. As an example, a PTCBI layer can be created that absorbs photons up to wavelengths of about 1 μm and a PbSe quantum dot layer, or PbS quantum dot layer, can be created that also absorbs photons having wavelengths in the range of about 1

µm to about 3 µm, so as to expand to wavelength range for detection. Other wavelength ranges can be accomplished by proper selection of the material in the absorption layer.

Figure 4:
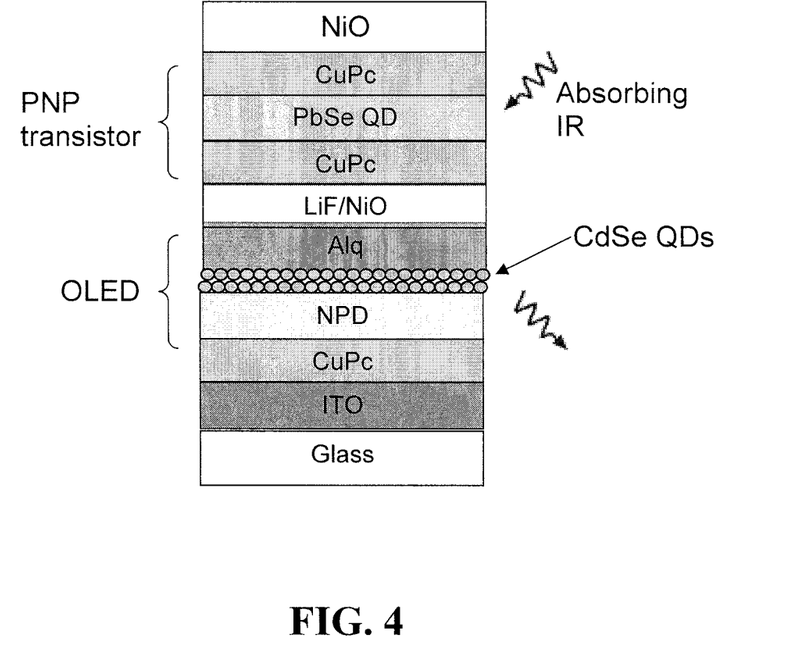
FIG. 4 shows an embodiment of the subject display device incorporating CdSe quantum dots in the emission layer.

In a further specific embodiment, referring to FIG. 4, the 60 nm Alq3 layer of the light emitting device from FIG. 1 or FIG. 3 is replaced with a 50 nm Alq3 layer and a CdSe quantum dot layer. The material for the quantum dot layer can facilitate emission of light at wavelengths different from the light emitted by the Alq3 layer. Accordingly, other materials can also be utilized in accordance with the subject invention.

Figure 5:
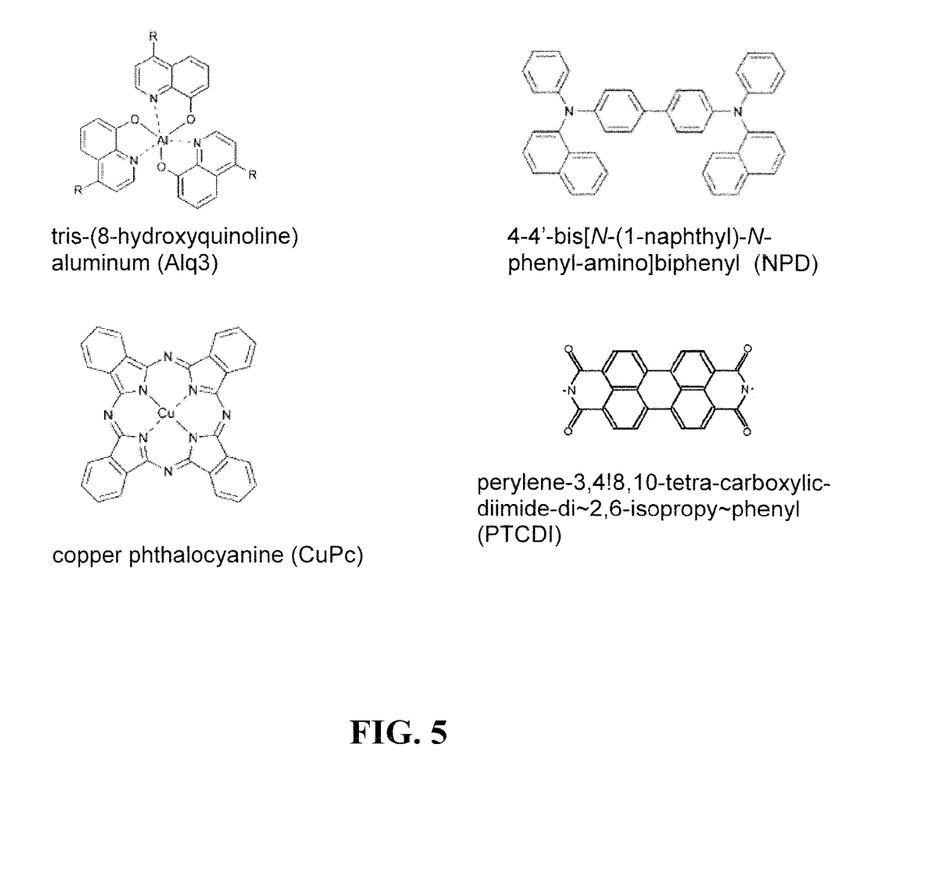
FIG. 5 shows materials that can be used in various embodiments of the subject invention.

FIG. 5 shows structures of materials that can be utilized with embodiments of the subject invention. Shown in FIG. 5 are structures for tris-(8-hydroxyquinoline) aluminum (Alq3), 4-4'-bis[N-(1-naphthyl)-N-phenyl-amino]biphenyl (NPD), copper phthalocyanine (CuPc), and perylene-3,4!8,10-tetra-carboxylic-diimide-di~2,6-isopropy~phenyl (PTCDI).

Although exemplary embodiments directed to a phototransistor and phototransistor/OLED combination fabricated primarily from organic material layers have been described, additional embodiments can utilize inorganic materials for the phototransistor and/or the light emitting device. Examples of inorganic materials that can be used to fabricate phototransistors and/or light emitting device in accordance with the subject invention include, but are not limited to, amorphous silicon, germanium, and diamond-like carbon. Thin film amorphous silicon could have PbSe or PbS to absorb IR. An inorganic OLED can use ZnO to emit visible light. The use of inorganic materials in the absorption layer can allow detection of IR with wavelengths in the range of about 1 µm to 4 µm. These materials and the techniques to fabricate phototransistors and/or OLED's with structures similar to those shown in FIGS. 1, 2, 3, and 4 are known to those skilled in the art. In this way, an inorganic phototransistor can be incorporated with an organic OLED and an organic phototransistor can be incorporated with an inorganic OLED.

Figure 6:
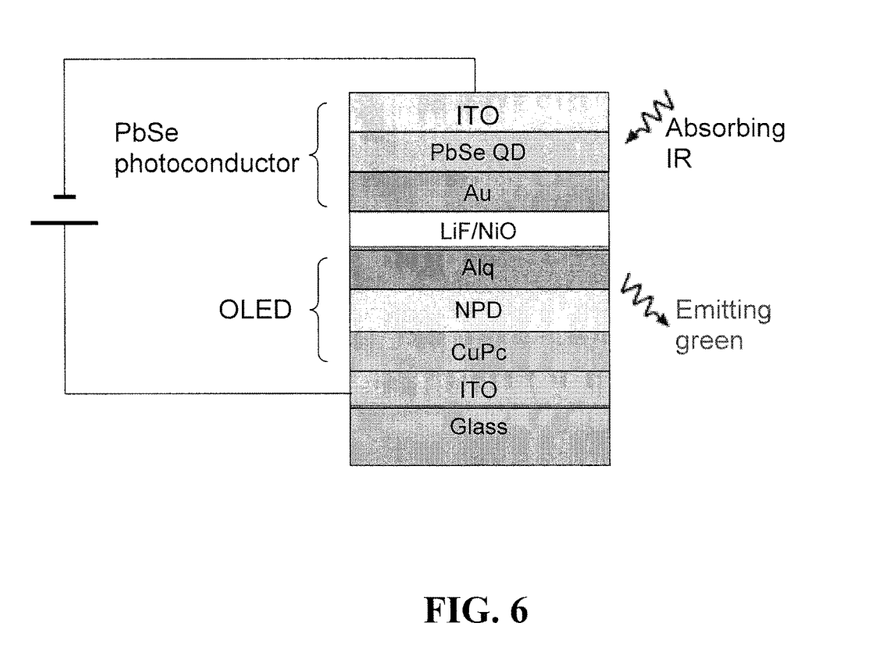
FIG. 6 shows an embodiment using PbSe quantum dots as photoconductors.

Embodiments of the present invention can incorporate a photoconductor. In specific embodiments, a photoconductor can replace the phototransistor described in the above embodiments. FIG. 6 shows a photoconductor device incorporating PbSe quantum dots. The PbSe quantum dots can be used to sense photons with wavelengths between 1 µm to 3 µm. The photoconductor structure can be formed of photoconductive material arranged between two electrodes. In one embodiment, one electrode can be formed of gold (Au) and the second electrode can be formed of ITO. In an embodiment, PbS quantum dots can be used in the place of the PbSe quantum dot layer. In operation, carriers can be photoexcited in the quantum dot (QD) layer through the absorption of IR rays. The carriers can travel to an OLED element to emit, for example, green light. In particular, electrons may be injected into an emissive layer of the OLED element and recombine with holes to give off light.

In the embodiment shown in FIG. 6, the photoconductor can be formed on an OLED element. The OLED element can be formed on a glass substrate and can incorporate an ITO layer formed on the substrate, a CuPc layer formed on the ITO layer to act as a hole transport layer, a NPD layer formed on the CuPc layer to act as a hole transport layer, an Alq layer formed on the NPD layer, and a LiF/NiO layer for charge generation formed on the Alq layer. The photoconductor can be formed on the LiF/NiO layer by depositing a gold layer on the LiF/NiO layer, forming a photoconductive material layer on the gold layer, and forming an ITO layer on the photoconductive material layer.

Figure 7:
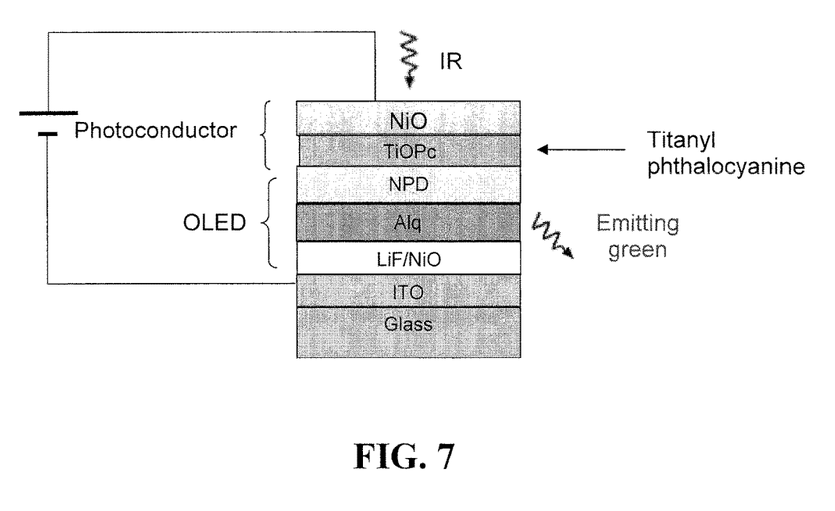
FIG. 7 shows an embodiment using organic materials as the photoconductors.

FIG. 7 shows a photoconductor device incorporating organic materials. Referring to FIG. 7, one of the electrodes for the photoconductor can be eliminated when incorporated with an OLED element. In particular, the photoconductive material can be in direct contact with a hole transporting layer of an OLED. In an embodiment, titanyl phthalocyanine (TiOPc) can be used as the photoconductive material of a photoconductor device. The TiOPc can respond to IR rays because TiOPc absorbs wavelengths at 0.8 µm. The OLED element can be formed on a glass substrate and can include an ITO layer formed on the substrate, a LiF/NiO layer formed on the ITO layer, an Alq layer formed on the LiF/NiO layer and a NPD layer formed on the Alq Layer. The photoconductive material can be formed directly on the NPD layer without an intervening electrode.

Figure 8:
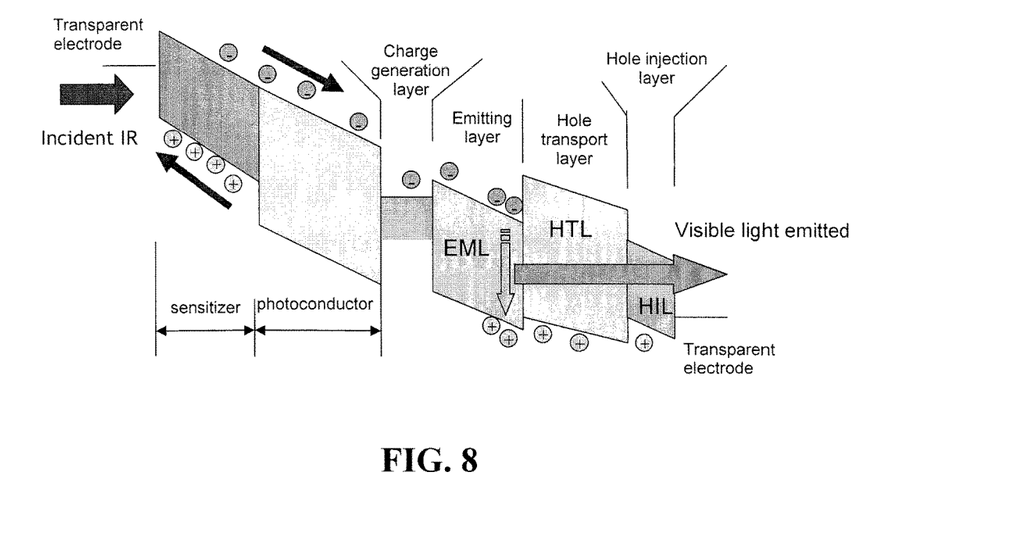
FIG. 8 shows an embodiment using a photoconductor as a light sensor.

FIG. 8 shows an embodiment incorporating a photoconductor as the light sensor. A photoconductor can have very large gain or amplification and is ideal to amplify the signal. The photoconductor device includes two layers, a charge transport layer and a sensitizer. NPD can be used as a charge transport layer and PbSe, PbS, and/or InAs quantum dots can be utilized for photon absorption.

In operation, carriers can be photoexcited in the TiOPc layer. The carriers can travel to the OLED element to emit, for example, green light. In particular, holes can be injected into the NPD layer to recombine with electrons and give off light.

In embodiments of the present invention, the gain in photoconductors can be as large as 100,000.

For embodiments incorporating photoconductors instead of phototransistors, fabrication may involve less process steps due to embodiments of photoconductors being single layer devices instead of a three-layer NPN or PNP structure.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

The invention claimed is:

1. A device, comprising:
   an absorbing layer comprising quantum dots;
   an organic light emitting diode (OLED), wherein the OLED comprises a light-emitting layer;
   a first electrode transparent to IR light, wherein the IR light to be detected passes through the first electrode and enters the absorbing layer, wherein the IR light is absorbed in the absorbing layer so as to generate charge carriers, wherein the charge carriers are injected into the OLED so as to generate photons in the light-emitting layer; and
   a second electrode transparent to the photons generated in the light-emitting layer, wherein the photons generated in the light-emitting layer pass through the second electrode so as to exit the device,
   wherein the device allows detection of wavelengths in the range of about 1 µm to about 4 µm.

2. The device according to claim 1, wherein the device comprises a phototransistor, wherein the phototransistor incorporates the absorbing layer.

3. The device according to claim 2, wherein the phototransistor is a PNP bipolar transistor or an NPN bipolar transistor.

4. The device according to claim 2, wherein the phototransistor is configured to absorb light with a wavelength in a range of 700 nm to 14 μm.

5. The device according to claim 2, wherein the phototransistor and OLED are integrated.

6. The device according to claim 2, wherein the thickness of the phototransistor and OLED is less than about 1 micron.

7. The device according to claim 1, wherein the device comprises a photoconductor, wherein the photoconductor incorporates the absorbing layer.

8. The device according to claim 7, wherein the photoconductor is in direct contact with a hole transporting layer of the OLED.

9. The device according to claim 1, wherein the light-emitting layer comprises a first organic material and particles of materials associated with emission of photons of different wavelengths than the first organic material of the light-emitting layer.

10. The device according to claim 9, wherein the absorbing layer comprises a second organic material and particles of materials sensitive to photons of different wavelengths than the second organic material of the absorbing layer.

11. The device according to claim 1, wherein the device comprises a display for displaying an output image to a user, wherein the output image corresponds to an infrared image incident on the device, wherein the display incorporates the OLED.

12. The device according to claim 11, wherein the device comprises a phototransistor, wherein the phototransistor incorporates the absorbing layer, wherein the phototransistor and the OLED are in series.

13. The device according to claim 12, wherein the phototransistor comprises a first electrode transparent to IR light, wherein IR light to be detected passes through the first electrode and enters the absorbing layer of the phototransistor, wherein the IR light is absorbed in the absorbing layer so as to generate charge carriers, wherein the charge carriers are injected into the OLED so as to generate photons, wherein the OLED comprises a second electrode transparent to the generated photons wherein the generated photons pass through the second electrode.

14. The device according to claim 13, wherein the generated photons are in the visible range.

15. The device according to claim 14, wherein the generated photons passing through the second electrode produce the output image, wherein the output image corresponds to an infrared image incident on the first electrode.

16. The device according to claim 1, wherein the absorbing layer comprises PbS quantum dots and/or PbSe quantum dots.

17. The device according to claim 1, wherein the absorbing layer comprises PTCBI.

18. The device according to claim 1, wherein the emitting layer comprises Alq3.

19. The device according to claim 1, wherein the emitting layer comprises a CdSe quantum dot layer.

20. The device according to claim 1, wherein the light-emitting layer comprises an inorganic material.

21. The IR detector according to claim 1, wherein the device allows detection of wavelengths in the range of about 1 μm to about 3 μm.

22. The device according to claim 1, wherein the device comprises a phototransistor, wherein the phototransistor comprises
   a first electrode;
   a first transistor layer;
   a second transistor layer, wherein the second transistor layer is the absorbing layer;
   a third transistor layer, wherein the first transistor layer, the second transistor layer, and the third transistor layer form a bipolar transistor; and
   a second electrode, wherein IR light incident on the first electrode passes through the first electrode and is absorbed in the second transistor layer, wherein charge carriers are generated by the absorbed photons and collected by the first and second electrodes to produce a current.

23. The device according to claim 22, wherein the phototransistor is configured to absorb light with a wavelength in a range of 700 nm to 14 μm.

24. The device according to claim 22, wherein the device allows detection of wavelengths in the range of about 1 μm to about 3 μm.

25. The device according to claim 1, wherein the absorbing layer, the light-emitting layer, and the OLED are formed via a plurality of organic thin films.

26. The device according to claim 1, wherein the device comprises a phototransistor, wherein the phototransistor incorporates the absorbing layer, wherein the phototransistor and the OLED are in series, wherein the phototransistor comprises a first electrode transparent to IR light, wherein IR light to be detected passes through the first electrode and enters the absorbing layer of the phototransistor, wherein the IR light is absorbed in the absorbing layers so as to generate charge carriers, wherein the charge carriers are injected into the OLED so as to generate photons, wherein the OLED comprises a second electrode transparent to the generated photons wherein the generated photons pass through the second electrode.

27. The device according to claim 26, wherein the generated photons passing through the second electrode produce the output image, wherein the output image corresponds to an infrared image incident on the first electrode.

28. The device according to claim 27, wherein the generated photons are in the visible range.

29. The device according to claim 1, wherein the photons generated in the light-emitting layer are in the visible range.

30. The device according to claim 1, wherein the photons generated in the light-emitting layer that pass through the second electrode so as to exit the device produce an output image, wherein the output image corresponds to an infrared image incident on the first electrode.

31. The device according to claim 1, wherein the absorbing layer comprises particles of materials sensitive to infrared radiation.

32. A device, comprising:
   a transparent substrate;
   an electrode; and
   a plurality of layers positioned between the transparent substrate and the electrode, wherein the plurality of layers comprises an absorbing layer comprising quantum dots and an OLED comprising a light-emitting layer, wherein each layer positioned between the transparent substrate and the electrode is a thin film,
   wherein the device allows detection of wavelengths in the range of about 1 μm to about 4 μm.

33. A device, comprising:
   an absorbing layer comprising quantum dots;
   a light-emitting layer; and
   a charge generation layer positioned between the absorbing layer and the light-emitting layer, wherein the absorbing layer and the charge generation layer are separate layers, wherein the absorbing layer is capable of absorbing infrared radiation so as to generate charge carriers.

34. The device according to claim 33, wherein the charge generation layer comprises LiF and/or NiO.

35. The device according to claim 33, wherein the device comprises an OLED comprising the light-emitting layer.

* * * * *